(12) United States Patent
Im

(10) Patent No.: US 12,087,807 B2
(45) Date of Patent: Sep. 10, 2024

(54) DISPLAY DEVICE, METHOD OF MANUFACTURING THE SAME, AND TILED DISPLAY DEVICE INCLUDING THE SAME

(71) Applicant: Samsung Display Co., LTD., Yongin-si (KR)

(72) Inventor: Jun Mo Im, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 459 days.

(21) Appl. No.: 17/484,224

(22) Filed: Sep. 24, 2021

(65) Prior Publication Data

US 2022/0208850 A1 Jun. 30, 2022

(30) Foreign Application Priority Data

Dec. 31, 2020 (KR) .......................... 10-2020-0189054

(51) Int. Cl.
*H01L 27/12* (2006.01)
*H01L 27/15* (2006.01)
*H01L 29/786* (2006.01)
*H01L 33/00* (2010.01)

(52) U.S. Cl.
CPC ...... *H01L 27/156* (2013.01); *H01L 29/78633* (2013.01); *H01L 33/005* (2013.01)

(58) Field of Classification Search
None
See application file for complete search history.

(56) References Cited

U.S. PATENT DOCUMENTS

| 2010/0128205 | A1* | 5/2010 | Rho | ................. G02F 1/133528 349/96 |
| 2016/0043349 | A1* | 2/2016 | Park | ..................... H10K 50/856 257/40 |
| 2020/0211929 | A1 | 7/2020 | Son et al. | |

FOREIGN PATENT DOCUMENTS

| CN | 109321143 | 2/2019 |
| KR | 10-1148791 | 5/2012 |
| KR | 10-1157425 | 6/2012 |

OTHER PUBLICATIONS

Mian Wang et al., "Enhancement of interfacial adhesion and dynamic mechanical properties of poly(methyl methacrylate)/multiwalled carbon nanotube composites with amine-terminated poly(ethylene oxide)", Carbon, 2006, pp. 613-617, vol. 44.

(Continued)

*Primary Examiner* — Bilkis Jahan
(74) *Attorney, Agent, or Firm* — KILE PARK REED & HOUTTEMAN PLLC

(57) ABSTRACT

A display device includes a first substrate, a first connection line disposed on a surface of the first substrate, a thin film transistor layer disposed on the first connection line, the thin film transistor layer including a plurality of thin film transistors, a first pad portion disposed on another surface of the first substrate, and a plurality of conductive parts disposed in the first substrate, including a material different from those of the first connection line and the first pad portion, and electrically connecting the first connection line and the first pad portion. The plurality of conductive parts include carbon nanotubes.

11 Claims, 12 Drawing Sheets

(56) References Cited

OTHER PUBLICATIONS

Kuang-Ting Hsiao et al., "Use of epoxy/multiwalled carbon nanotubes as adhesives to join graphite fibre reinforced polymer composites", Nanotechnology, May 15, 2003, pp. 791-793, vol. 14.
Seung I. Cha et al., "Extraordinary Strengthening Effect of Carbon Nanotubes in Metal-Matrix Nanocomposites Processed by Molecular-Level Mixing", Advanced Materials, 2005, pp. 1377-1381, vol. 17, DOI: 10.1002/adma.200401933.

\* cited by examiner

LA: LA1, LA2, LA3

DISPLAY DEVICE, METHOD OF MANUFACTURING THE SAME, AND TILED DISPLAY DEVICE INCLUDING THE SAME

CROSS REFERENCE TO RELATED APPLICATION(S)

This application claims priority from Korean Patent Application No. 10-2020-0189054 filed on Dec. 31, 2020, in the Korean Intellectual Property Office, the disclosure of which is incorporated herein by reference in its entirety.

BACKGROUND

1. Technical Field

The disclosure relates to a display device, a method of manufacturing the same, and a tiled display device including the same.

2. Description of the Related Art

With the advancement of the information society, requirements for a display device for displaying an image are increasing in various forms. For example, the display device is applied to various electronic devices such as a smartphone, a digital camera, a laptop computer, a navigation device, and a smart TV. The display device may be a flat panel display device such as a liquid crystal display device, a field emission display device, or an organic light-emitting display device. Among the flat panel display devices, a light-emitting display device includes a light-emitting element by which each pixel of a display panel can emit light by itself, so that an image may be displayed without a backlight unit that provides light to the display panel.

When the display device is manufactured in a large size, a failure rate of the light-emitting element may be increased due to an increase in the number of pixels, and productivity or reliability of the display device may be deteriorated. In order to solve this, a tiled display device may realize a large-sized screen by connecting display devices having a relatively small size. The tiled display device may include a boundary portion called a seam between the display devices due to a non-display area or a bezel region of each of the display devices adjacent to each other. In case that an image is displayed on the entire screen, the boundary portion between the display devices gives a feeling of disconnection to the entire screen, thereby reducing the degree of immersion of the image.

SUMMARY

An aspect of the disclosure provides a display device capable of improving productivity and reliability by omitting a process of forming a through-hole in a substrate to reduce the degree of difficulty of a manufacturing process, a method of manufacturing the same, and a tiled display device including the same.

Another aspect of the disclosure provides a tiled display device capable of eliminating a feeling of disconnection between a plurality of display devices and improving the degree of immersion of an image by preventing a boundary portion or a non-display area between the plurality of display devices from being recognized.

According to an embodiment of the disclosure, a display device may comprise a first substrate, a first connection line disposed on a surface of the first substrate, a thin film transistor layer disposed on the first connection line and comprising a plurality of thin film transistors, a first pad portion disposed on another surface of the first substrate, and a plurality of conductive parts disposed in the first substrate, including a material different from those of the first connection line and the first pad portion, and electrically connecting the first connection line and the first pad portion. The plurality of conductive parts may include carbon nanotubes.

A diameter of each of the plurality of conductive parts on a plane may be about 100 nm or less.

The first connection line may overlap an end of each of the plurality of conductive parts, and the first pad portion may overlap another end of each of the plurality of conductive parts.

The display device may further comprise a light blocking layer. The light blocking layer and the first connection line may be disposed on a same layer, and the light blocking layer may overlap each of the plurality of thin film transistors in a thickness direction of the first substrate.

The thin film transistor layer may comprise a buffer layer overlapping the first connection line and the light blocking layer, a gate insulating film disposed on the buffer layer, an interlayer insulating film disposed on the gate insulating film, and a connection electrode disposed on the interlayer insulating film and electrically connected to the thin film transistor.

The thin film transistor layer may comprise a second connection line spaced apart from the connection electrode on the interlayer insulating film and electrically connected to the first connection line.

The display device may further comprise a flexible film disposed on another surface of the first substrate and connected to the first pad portion, and a data driver disposed on the flexible film and supplying a data voltage to the first pad portion.

According to an embodiment of the disclosure, a method of manufacturing a display device may comprise providing a carrier substrate and a first substrate on the carrier substrate, disposing a plurality of metal seeds on the first substrate, forming a plurality of conductive parts between the first substrate and the plurality of metal seeds, removing the plurality of metal seeds disposed on the first substrate, forming a second substrate disposed on the first substrate and overlapping side surfaces of the plurality of conductive parts, forming a display layer on a surface of the second substrate, removing the carrier substrate and the first substrate, and forming a first pad portion on another surface of the second substrate.

The plurality of conductive parts may include carbon nanotubes.

The forming of the plurality of conductive parts may include applying an electric field between the plurality of metal seeds and the first substrate, and depositing the plurality of conductive parts on the first substrate, and aligning the plurality of conductive parts in a thickness direction of the first substrate by the electric field.

The removing of the plurality of metal seeds may comprise removing the plurality of metal seeds disposed on an upper end of each of the plurality of conductive parts by an ashing process.

The forming of the second substrate may comprise forming the second substrate such that upper ends of the plurality of conductive parts and an upper end of the second substrate are disposed on a same plane.

The forming of the display layer may comprise forming a first connection line overlapping upper ends of the plurality of conductive parts, and forming a light blocking layer spaced apart from the first connection line.

The forming of the display layer may comprise forming a buffer layer overlapping the first connection line and the light blocking layer, forming a gate insulating film and an interlayer insulating film on the buffer layer, and forming a second connection line disposed on the interlayer insulating film and electrically connected to the first connection line.

The forming of the first pad portion may comprise forming the first pad portion overlapping lower ends of the plurality of conductive parts.

The method may further comprise forming a second pad portion connected to the first pad portion, forming a flexible film on the second pad portion, and forming a data driver on the flexible film.

According to an embodiment of the disclosure, a tiled display device may comprise a plurality of display devices each including a display area including a plurality of pixels, and a non-display area surrounding the display area, and a coupling member connecting the plurality of display devices. Each of the plurality of display devices may comprise a substrate, a connection line disposed on a surface of the substrate, a thin film transistor layer disposed on the connection line and including a plurality of thin film transistors, a pad portion disposed on another surface of the substrate, and a plurality of conductive parts disposed in the substrate, including a material different from those of the connection line and the pad portion, and electrically connecting the connection line and the pad portion.

The plurality of conductive parts may include carbon nanotubes.

The connection line may overlap an end of each of the plurality of conductive parts, and the pad portion may overlap another end of the plurality of conductive parts.

Each of the plurality of display devices may comprise a light blocking layer, the light blocking layer and the connection line may be disposed on a same layer, and the light blocking layer may overlap each of the plurality of thin film transistors in a thickness direction of the substrate.

Aspects of the disclosure are not limited to the aspects mentioned above, and other technical aspects not mentioned above will be clearly understood by those skilled in the art from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
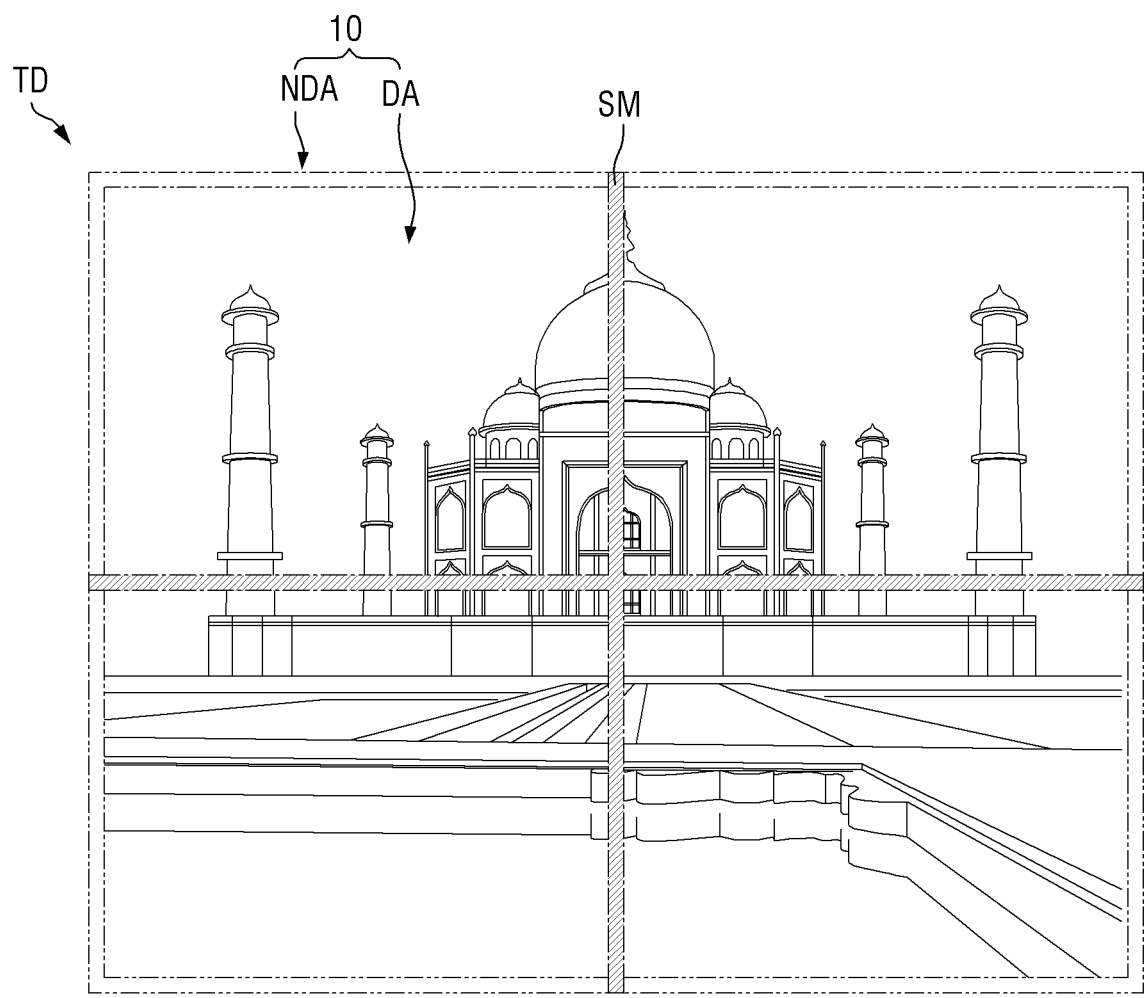
FIG. 1 is a plan view schematically illustrating a tiled display device according to an embodiment.
Figure 1:
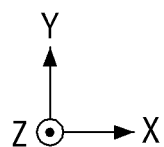

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a schematic plan view showing a tiled display device according to an embodiment.

Referring to FIG. 1, a tiled display device TD may include display devices 10. The display devices 10 may be arranged in a lattice shape, but the disclosure is not limited thereto. The display devices 10 may be connected in a first direction (an X-axis direction) or a second direction (a Y-axis direction), and the tiled display device TD may have a specific shape. For example, each of the display devices 10 may have the same size, but the disclosure is not limited thereto. As another example, the display devices 10 may have different sizes from each other.

Each of the display devices 10 may have a rectangular shape including long sides and short sides. The display devices 10 may be disposed so that long sides or short sides thereof are connected to each other. Some (or a part of) display devices 10 may be disposed at an edge of the tiled display device TD to form a side of the tiled display device TD. Some other (or another part of) display devices 10 may be disposed at a corner of the tiled display device TD and may form two adjacent sides of the tiled display device TD. Still some other (or another part of) display devices 10 may be disposed inside the tiled display device TD, and may be surrounded by other display devices 10.

Each of the display devices 10 may include a display area DA and a non-display area NDA. The display area DA may include pixels to display an image. Each of the pixels may include an organic light-emitting diode (OLED) including an organic emission layer, a micro light-emitting diode (Micro LED), a quantum dot light-emitting diode including a quantum dot emission layer, or an inorganic light-emitting element including an inorganic semiconductor. Hereinafter, a description has been made focusing on that each of the pixels includes the inorganic light-emitting element, but the disclosure is not limited thereto. The non-display area NDA may be disposed around the display area DA to surround the display area DA and may not display an image.

The tiled display device TD may have an overall planar shape, but the disclosure is not limited thereto. The tiled display device TD may have a three-dimensional shape, thereby providing a stereoscopic effect to a user. For example, in case that the tiled display device TD has a three-dimensional shape, at least some of the display devices 10 may have a curved shape. As another example, each of the display devices 10 has a planar shape and is connected to each other at a predetermined angle, and thus the tiled display device TD may have a three-dimensional shape.

The tiled display device TD may include a coupling region SM disposed between display areas DA. The tiled display device TD may be formed by connecting the non-display areas NDA of adjacent display devices 10 to each other. The display devices 10 may be connected to each other by a coupling member or an adhesive member disposed in the coupling region SM. The coupling region SM of each of the display devices 10 may not include a pad portion or a flexible film attached to the pad portion. Therefore, a distance between the display areas DA of the display devices 10 may be so close that the coupling region SM between the display devices 10 is not recognized by a user. A reflectance of external light in the display area DA of each of the display devices 10 and a reflectance of external light in the coupling region SM between the display devices 10 may be substantially the same. Therefore, the tiled display device TD may prevent the user from recognizing the coupling region SM between the display devices 10, thereby improving a feeling of disconnection between the display devices 10 and improving the degree of immersion in an image.

Figure 2:
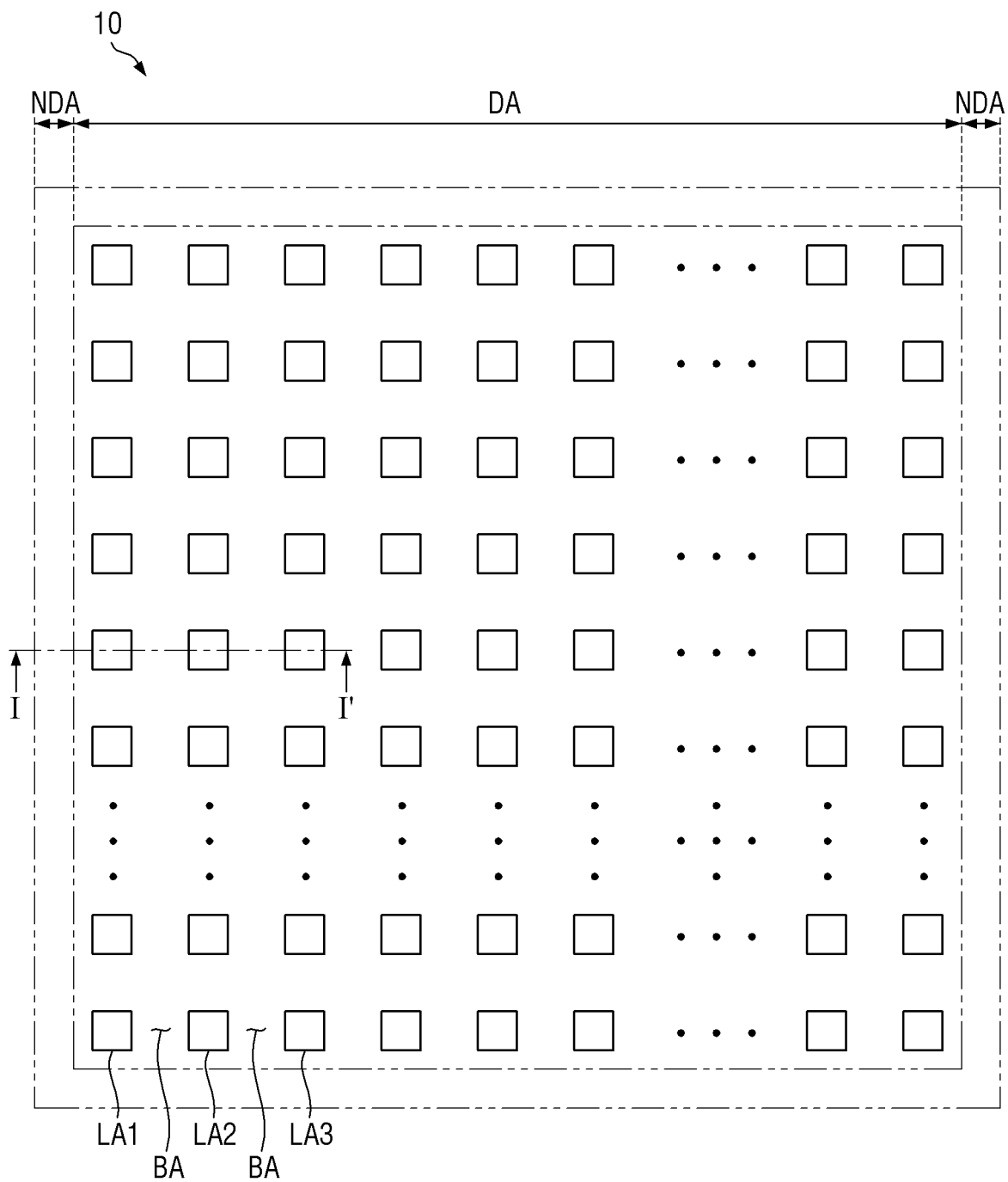
FIG. 2 is a plan view schematically illustrating a display device according to an embodiment.
Figure 2:
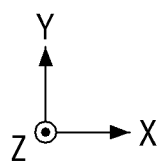

FIG. 2 is a plan view schematically illustrating a display device according to an embodiment.

Referring to FIG. 2, a display device 10 may include pixels arranged in rows and columns in a display area DA. Each of the pixels may include a light-emitting region LA defined by a pixel defining film or a bank and may emit light having a predetermined peak wavelength through the light-emitting region LA. For example, the display area DA of the display device 10 may include first to third light-emitting regions LA1, LA2, and LA3. Each of the first to third light-emitting regions LA1, LA2, and LA3 may be a region in which light generated by a light-emitting element EL (see FIG. 3) of the display device 10 is emitted to the outside of the display device 10.

The first to third light-emitting regions LA1, LA2, and LA3 may emit light, having a predetermined peak wavelength to the outside of the display device 10. The first light-emitting region LA1 may emit light of a first color, the second light-emitting region LA2 may emit light of a second color, and the third light-emitting region LA3 may emit light of a third color. For example, the light of the first color may be red light having a peak wavelength in a range of about 610 nm to about 650 nm, the light of the second color may be green light having a peak wavelength in a range of about 510 nm to about 550 nm, and the light of the third color may be blue light having a peak wavelength in a range of about 440 nm to about 480 nm, but the disclosure is not limited thereto.

The first to third light-emitting regions LA1, LA2, and LA3 may be sequentially and repeatedly disposed in the first direction (e.g., the X-axis direction) of the display area DA. For example, an area of the first light-emitting region LA1 may be greater than that of the second light-emitting region LA2, and the area of the second light-emitting region LA2 may be greater than that of the third light-emitting region LA3. As another example, the area of the first light-emitting region LA1, the area of the second light-emitting region LA2, and the area of the third light-emitting region LA3 may be substantially the same.

The display area DA of the display device 10 may include a light blocking region BA surrounding the light-emitting regions LA. The light blocking region BA may prevent color mixing of light emitted from the first to third light-emitting regions LA1, LA2, and LA3.

Figure 3:
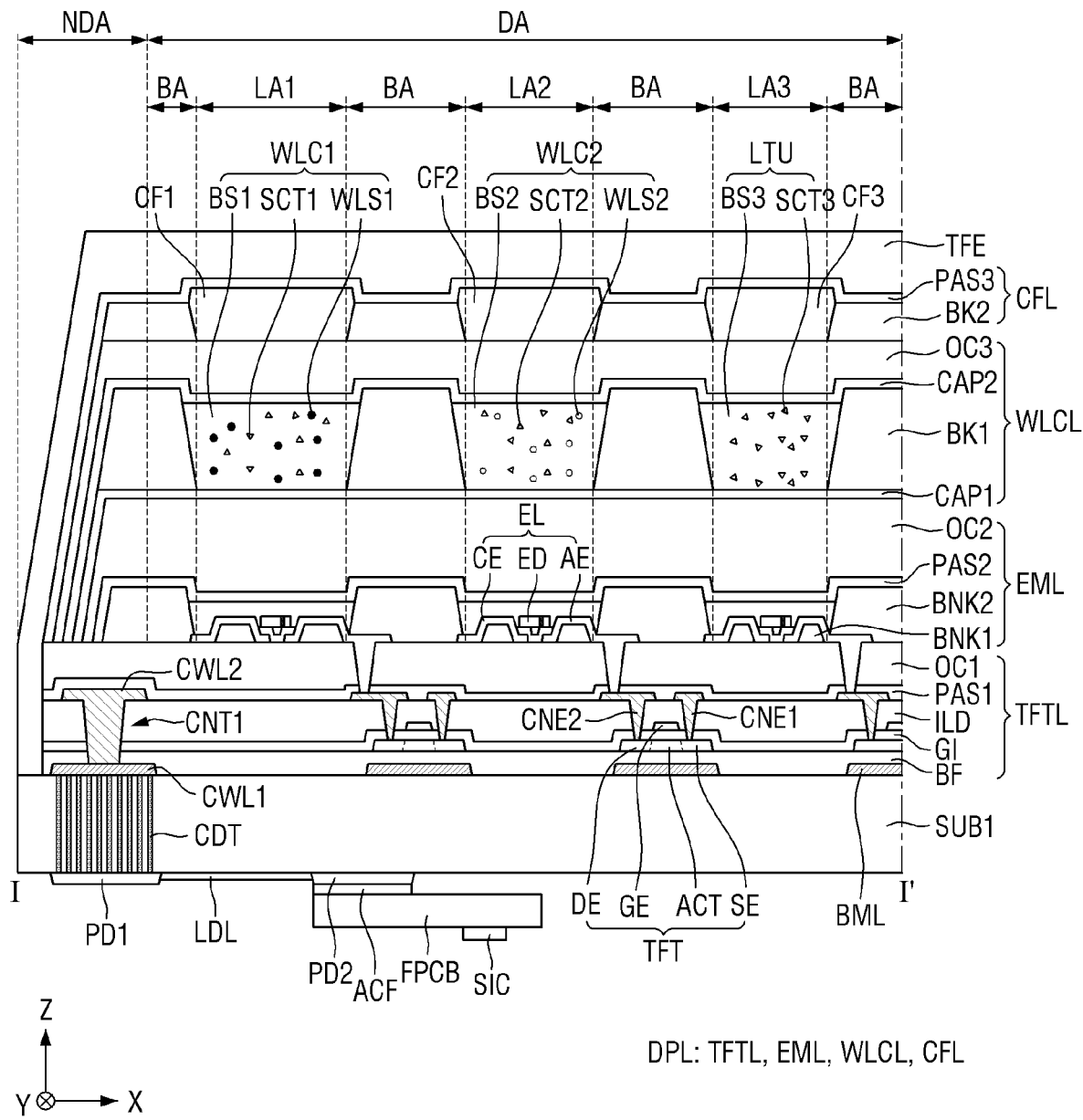
FIG. 3 is a schematic cross-sectional view taken along line I-I' in FIG. 2.

FIG. 3 is an example of a schematic cross-sectional view taken along line I-I' in FIG. 2.

Referring to FIG. 3, the display area DA of the display device 10 may include the first to third light-emitting regions LA1, LA2, and LA3. Each of the first to third light-emitting regions LA1, LA2, and LA3 may be a region in which light generated by a light-emitting diode ED of the display device 10 is emitted to the outside of the display device 10.

The display device 10 may include a first substrate SUB1, a display layer DPL, an encapsulation layer TFE, conductive parts CDT, a first pad portion PD1, a lead line LDL, a second pad portion PD2, a flexible film FPCB, and a data driver SIC.

The first substrate SUB1 may be a base substrate or a base member and may be made of an insulating material such as a polymer resin. The first substrate SUB1 may be a flexible substrate that can be bent, folded, and rolled. For example, the first substrate SUB1 may include polyimide (PI), but the disclosure is not limited thereto.

The display layer DPL may be disposed on the first substrate SUB1. The display layer DPL may include a thin film transistor layer TFTL, a light-emitting element layer EML, a wavelength conversion layer WLCL, and a color filter layer CFL. The thin film transistor layer TFTL may include a light blocking layer BML, a first connection line CWL1, a buffer layer BF, a thin film transistor TFT, a gate insulating film GI, an interlayer insulating film ILD, first and second connection electrodes CNE1 and CNE2, a second connection line CWL2, a first protective layer PAS1, and a first planarization layer OC1.

The light blocking layer BML may be disposed on the first substrate SUB1. The light blocking layer BML may overlap the thin film transistor TFT in a thickness direction (a Z-axis direction) to block external light incident on the thin film transistor TFT. For example, the light blocking layer BML may be formed as a single layer or multiple layers made of one among molybdenum (Mo), aluminum (Al), chromium (Cr), gold (Au), titanium (Ti), nickel (Ni), neodymium (Nd), and copper (Cu), or an alloy thereof. As another example, the light blocking layer BML may be an organic film including a black pigment.

The first connection line CWL1 may be disposed on the first substrate SUB1 to be spaced apart from the light blocking layer BML. The first connection line CWL1 and the light blocking layer BML may be formed of the same material on the same layer. The first connection line CWL1 may cover (or overlap) an end of each of the conductive parts CDT. For example, a first connection line CWL1 may correspond to ten or more conductive parts CDT, but the disclosure is not limited thereto. The first connection line CWL1 may be electrically connected to the first pad portion PD1 by the conductive parts CDT. The first connection line CWL1 may supply an electric signal, received from the first pad portion PD1 to the thin film transistor layer TFTL through the second connection line CWL2.

The buffer layer BF may cover (or overlap) the light blocking layer BML, the first connection line CWL1, and the first substrate SUB1. The buffer layer BF may include a first contact hole CNT1 into which the second connection line CWL2 is inserted. The buffer layer BF may include an inorganic material capable of preventing penetration of air or moisture. For example, the buffer layer BF may include inorganic films alternately stacked each other.

The thin film transistor TFT may be disposed on the buffer layer BF and may form a pixel circuit of each of pixels. For example, the thin film transistor TFT may be a driving transistor or a switching transistor of the pixel circuit. The thin film transistor TFT may include a semiconductor region ACT, a gate electrode GE, a source electrode SE, and a drain electrode DE.

The semiconductor region ACT, the source electrode SE, and the drain electrode DE may be disposed on the buffer layer BF. The semiconductor region ACT may overlap the gate electrode GE in the thickness direction and may be insulated from the gate electrode GE by the gate insulating film GI. The source electrode SE and the drain electrode DE may be prepared by converting a material of the semiconductor region ACT into a conductor.

The gate electrode GE may be disposed on the gate insulating film GI. The gate electrode GE may overlap the semiconductor region ACT with the gate insulating film GI interposed therebetween.

The gate insulating film GI may be provided on the semiconductor region ACT, the source electrode SE, and the drain electrode DE. For example, the gate insulating film GI may cover (or overlap) the semiconductor region ACT, the source electrode SE, the drain electrode DE, and the buffer layer BF and may insulate the semiconductor region ACT and the gate electrode GE from each other. The gate insulating film GI may include the first contact hole CNT1 into which the second connection line CWL2 is inserted. The gate insulating film GI may include a contact hole through which each of the first and second connection electrodes CNE1 and CNE2 passes.

The interlayer insulating film ILD may be disposed on the gate electrode GE. The interlayer insulating film ILD may include the first contact hole CNT1 into which the second connection line CWL2 is inserted. Therefore, the first contact hole CNT1 may pass through the interlayer insulating film ILD, the gate insulating film GI, and the buffer layer BF. The interlayer insulating film ILD may include a contact hole through which each of the first and second connection electrodes CNE1 and CNE2 passes.

The first and second connection electrodes CNE1 and CNE2 may be disposed on the interlayer insulating film ILD to be spaced apart from each other. The first connection electrode CNE1 may electrically connect a data line or a power line to the source electrode SE of the thin film transistor TFT. The first connection electrode CNE1 may contact the source electrode SE through the contact hole provided in the interlayer insulating film ILD and the gate insulating film GI.

The second connection electrode CNE2 may electrically connect the drain electrode DE of the thin film transistor TFT and a first electrode AE of the light-emitting element EL. The second connection electrode CNE2 may contact the drain electrode DE through the contact hole provided in the interlayer insulating film ILD and the gate insulating film GI.

The second connection line CWL2 may be disposed on the interlayer insulating film ILD to be spaced apart from the first and second connection electrodes CNE1 and CNE2. The second connection line CWL2 and the first and second connection electrodes CNE1 and CNE2 may be formed of the same material on the same layer. The second connection line CWL2 may be inserted into the first contact hole CNT1 to be electrically connected to the first connection line CWL1 disposed on the first substrate SUB1.

For example, the second connection line CWL2 may be electrically connected to the data line to supply a data voltage to the thin film transistor TFT. As another example, the second connection line CWL2 may be electrically connected to the power line to supply a power voltage to the thin film transistor TFT.

The first protective layer PAS1 may cover (or overlap) the first and second connection electrodes CNE1 and CNE2, the second connection line CWL2, and the interlayer insulating film ILD. The first protective layer PAS1 may protect the thin film transistor TFT. The first protective layer PAS1 may include a contact hole through which the first electrode AE of the light-emitting element EL passes.

The first planarization layer OC1 may be provided on the first protective layer PAS1 to planarize an upper end of the thin film transistor layer TFTL. For example, the first planarization layer OC1 may include the contact hole through which the first electrode AE of the light-emitting element EL passes. Here, the contact hole of the first planarization layer OC1 may be connected to the contact hole of the first protective layer PAS1. The first planarization layer OC1 may include an organic material.

The light-emitting element layer EML may include the light-emitting element EL, a first bank BNK1, a second bank BNK2, a second protective layer PAS2, and a second planarization layer OC2.

The light-emitting element EL may be disposed on the thin film transistor layer TFTL. The light-emitting element EL may include the first electrode AE, a second electrode CE, and the light-emitting diode ED.

The first electrode AE may be disposed on the first planarization layer OC1. For example, the first electrode AE may be disposed on the first bank BNK1 provided on the first planarization layer OC1 to cover (or overlap) the first bank BNK1. The first electrode AE may be disposed to overlap one of the first to third light-emitting regions LA1, LA2, and LA3 defined by the second bank BNK2. The first electrode AE may be electrically connected to the drain electrode DE of the thin film transistor TFT by the second connection electrode CNE2. The first electrode AE may be an anode of the light-emitting element EL, but the disclosure is not limited thereto.

The second electrode CE may be disposed on the first planarization layer OC1 to be spaced from the first electrode AE. For example, the second electrode CE may be disposed on the first bank BNK1 disposed on the first planarization layer OC1 to cover (or overlap) the first bank BNK1. The second electrode CE may be disposed to overlap one of the first to third light-emitting regions LA1, LA2, and LA3 defined by the second bank BNK2. For example, the second electrode CE may receive a low-potential voltage supplied to all pixels from a low-potential line. The second electrode CE may be a cathode of the light-emitting element EL, but the disclosure is not limited thereto.

The light-emitting diode ED may be disposed between the first electrode AE and the second electrode CE on the first planarization layer OC1. One end (or a first end) of the light-emitting diode ED may be electrically connected to the first electrode AE, and the other end (or a second end) of the light-emitting diode ED may be electrically connected to the second electrode CE. The light-emitting diode ED may have a size of a micrometer or nanometer scale and may be an inorganic light-emitting diode including an inorganic material. The inorganic light-emitting diode may be aligned between two electrodes by an electric field formed in a specific direction between the two electrodes facing each other.

For example, light-emitting diodes ED may include an active layer having the same material to emit light of the same wavelength band or light of the same color. Light emitted from each of the first to third light-emitting regions LA1, LA2, and LA3 may have the same color. For example, the light-emitting diodes ED may emit light of a third color or blue light having a peak wavelength in a range of about 440 nm to about 480 nm. Therefore, the light-emitting element layer EML may emit the light of the third color or the blue light.

The second bank BNK2 may be disposed in the light blocking region BA on the first planarization layer OC1. The second bank BNK2 may define the first to third light-emitting regions LA1, LA2, and LA3. For example, the second bank BNK2 may surround each of the first to third light-emitting regions LA1, LA2, and LA3, but the disclosure is not limited thereto. The second bank BNK2 may separate and insulate the first electrode AE or the second electrode CE of each of the light-emitting elements EL.

The second protective layer PAS2 may be disposed on the light-emitting elements EL and the second bank BNK2. The second protective layer PAS2 may cover (or overlap) the light-emitting elements EL and may protect the light-emitting elements EL. The second protective layer PAS2 may prevent impurities such as moisture or air from penetrating from the outside, thereby preventing damage to the light-emitting elements EL.

The second planarization layer OC2 may be provided on the second protective layer PAS2 to planarize an upper end of the light-emitting element layer EML. For example, the second planarization layer OC2 may include an organic material.

The wavelength conversion layer WLCL may include a first capping layer CAP1, a first light blocking member BK1, a first wavelength conversion unit (or part) WLC1, a second wavelength conversion part WLC2, a light transmission part LTU, a second capping layer CAP2, and a third planarization layer OC3.

The first capping layer CAP1 may be disposed on the second planarization layer OC2 of the light-emitting element layer EML. The first capping layer CAP1 may seal lower surfaces of the first and second wavelength conversion parts WLC1 and WLC2 and the light transmission part LTU. For example, the first capping layer CAP1 may include an inorganic material.

The first light blocking member BK1 may be disposed on the first capping layer CAP1 in the light blocking region BA. The first light blocking member BK1 may overlap the second bank BNK2 in the thickness direction. The first light blocking member BK1 may block transmission of light. The first light blocking member BK1 may improve a color reproduction rate (color gamut) of the display device 10 by preventing color mixing due to the penetration of light between the first to third light-emitting regions LA1, LA2, and LA3. The first light blocking member BK1 may be disposed in a lattice shape surrounding the first to third light-emitting regions LA1, LA2, and LA3 in a plan view.

The first wavelength conversion part WLC1 may be disposed on the first capping layer CAP1 in the first light-emitting region LA1. The first wavelength conversion part WLC1 may be surrounded by the first light blocking member BK1. The first wavelength conversion part WLC1 may include a first base resin BS1, a first scatter SCT1, and a first wavelength shifter WLS1.

The first base resin BS1 may contain a material having a relatively high light transmittance. The first base resin BS1 may be made of a transparent organic material. For example, the first base resin BS1 may include at least one of organic materials such as an epoxy-based resin, an acrylic-based resin, a cardo-based resin, an imide-based resin, and the like.

The first scatter SCT1 may have a refractive index different from that of the first base resin BS1 and may form an optical interface with the first base resin BS1. For example, the first scatter SCT1 may include light scattering materials or light scattering particles that scatter at least a part of transmitted light. For example, the first scatter SCT1 may include a metal oxide such as titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), or the like, or may include organic particles such as an acrylic-based resin or a urethane-based resin. The first scatter SCT1 may scatter light in a random direction regardless of an incident direction of incident light without substantially converting a peak wavelength of the incident light.

The first wavelength shifter WLS1 may convert or shift the peak wavelength of the incident light to a first peak wavelength. For example, the first wavelength shifter WLS1 may convert blue light provided from the display device 10 to red light having a single peak wavelength in a range of about 610 nm to about 650 nm and emit the red light. The first wavelength shifter WLS1 may be a quantum dot, a quantum rod, or a phosphor. The quantum dot may be particulate matter that emits a specific color while electrons transition from a conduction band to a valence band.

Some of the blue light provided from the light-emitting element layer EML may pass through the first wavelength conversion part WLC1 without being converted to red light by the first wavelength shifter WLS1. Among the blue light provided from the light-emitting element layer EML, light incident on a first color filter CF1 without being converted by the first wavelength conversion part WLC1 may be blocked by the first color filter CF1. Red light converted by the first wavelength conversion part WLC1 among the blue light provided from the light-emitting element layer EML may pass through the first color filter CF1 and be emitted to the outside. Therefore, the first light-emitting region LA1 may emit the red light.

The second wavelength conversion part WLC2 may be disposed on the first capping layer CAP1 in the second light-emitting region LA2. The second wavelength conversion part WLC2 may be surrounded by the first light blocking member BK1. The second wavelength conversion part WLC2 may include a second base resin BS2, a second scatter SCT2, and a second wavelength shifter WLS2.

The second base resin BS2 may include a material having a relatively high light transmittance. The second base resin BS2 may be made of a transparent organic material. For example, the second base resin BS2 and the first base resin BS1 may be made of the same material, or the second base resin BS2 may be made of the material that may be included in the first base resin BS1 as discussed in the disclosure.

The second scatter SCT2 may have a refractive index different from that of the second base resin BS2 and may form an optical interface with the second base resin BS2. For example, the second scatter SCT2 may include light scattering materials or light scattering particles that scatter at least a part of the transmitted light. For example, the second scatter SCT2 and the first scatter SCT1 may be made of the same material, or the second scatter SCT2 may be made of the material that may be included in the first scatter SCT1 as discussed in the disclosure.

The second wavelength shifter WLS2 may convert or shift the peak wavelength of the incident light to a second peak wavelength different from the first peak wavelength of the first wavelength shifter WLS1. For example, the second wavelength shifter WLS2 may convert blue light provided from the display device 10 to green light having a single peak wavelength in a range of about 510 nm to about 550 nm and emit the green light. The second wavelength shifter WLS2 may be a quantum dot, a quantum rod, or a phosphor. The second wavelength shifter WLS2 may include a material having an effect identical to that of the material that may be included in the first wavelength shifter WLS1 as discussed in the disclosure. The second wavelength shifter WLS2 may be formed of a quantum dot, a quantum rod, or a phosphor so that a wavelength conversion range thereof is different from a wavelength conversion range of the first wavelength shifter WLS1.

The light transmission part LTU may be disposed on the first capping layer CAP1 in the third light-emitting region LA3. The light transmission part LTU may be surrounded by the first light blocking member BK1. The light transmission part LTU may transmit the incident light while maintaining the peak wavelength of the incident light. The light transmission part LTU may include a third base resin BS3 and a third scatter SCT3.

The third base resin BS3 may include a material having a relatively high light transmittance. The third base resin BS3 may be made of a transparent organic material. For example, the third base resin BS3 and the first or second base resin BS1 and BS2 may be made of the same material, or the third base resin BS3 may be made of the material that may be included in the first base resin BS1 or the second base resin BS2 as discussed in the disclosure.

The third scatter SCT3 may have a refractive index different from that of the third base resin BS3 and may form an optical interface with the third base resin BS3. For example, the third scatter SCT3 may include light scattering materials or light scattering particles that scatter at least a part of the transmitted light. For example, the third scatter SCT3 and the first or second base resin BS1 and BS2 may be made of the same material, or the third scatter SCT3 may be made of the material that may be included in the first scatter SCT1 or the second scatter SCT2 as discussed in the disclosure.

The wavelength conversion layer WLCL is directly disposed on the second planarization layer OC2 of the light-emitting element layer EML, so that the display device 10 may not require a separate substrate for the first and second wavelength conversion parts WLC1 and WLC2 and the light transmission part LTU. Therefore, the first and second wavelength conversion parts WLC1 and WLC2 and the light transmission part LTU may be readily aligned in the first to third light-emitting regions LA1, LA2, and LA3, and a thickness of the display device 10 may be relatively reduced.

The second capping layer CAP2 may cover (or overlap) the first and second wavelength conversion parts WLC1 and WLC2, the light transmission part LTU, and the first light blocking member BK1. For example, the second capping layer CAP2 may seal the first and second wavelength conversion parts WLC1 and WLC2 and the light transmission part LTU to prevent damage to or contamination of the first and second wavelength conversion parts WLC1 and WLC2 and the light transmission part LTU. For example, the second capping layer CAP2 may include an inorganic material.

The third planarization layer OC3 may be disposed on the second capping layer CAP2 to planarize upper ends of the first and second wavelength conversion parts WLC1 and WLC2 and the light transmission part LTU. For example, the third planarization layer OC3 may include an organic material.

The color filter layer CFL may include a second light blocking member BK2, first to third color filters CF1, CF2, and CF3, and a third protective layer PAS3.

The second light blocking member BK2 may be disposed on the third planarization layer OC3 of the wavelength conversion layer WLCL in the light blocking region BA. The second light blocking member BK2 may overlap the first light blocking member BK1 or the second bank BNK2 in the thickness direction. The second light blocking member BK2 may block the transmission of light. The second light blocking member BK2 may improve a color reproduction rate (color gamut) of the display device 10 by preventing color mixing due to the penetration of light between the first to third light-emitting regions LA1, LA2, and LA3. The second light blocking member BK2 may be disposed in a lattice shape surrounding the first to third light-emitting regions LA1, LA2, and LA3 in a plan view.

The first color filter CF1 may be disposed on the third planarization layer OC3 in the first light-emitting region LA1. The first color filter CF1 may be surrounded by the second light blocking member BK2. The first color filter CF1 may overlap the first wavelength conversion part WLC1 in the thickness direction. The first color filter CF1 may selectively transmit light of a first color (e.g., red light) and may block or absorb light of a second color (e.g., green light) and light of a third color (e.g., blue light). For example, the first color filter CF1 may be a red color filter and may include a red colorant.

The second color filter CF2 may be disposed on the third planarization layer OC3 in the second light-emitting region LA2. The second color filter CF2 may be surrounded by the second light blocking member BK2. The second color filter CF2 may overlap the second wavelength conversion part WLC2 in the thickness direction. The second color filter CF2 may selectively transmit the light of the second color (e.g., green light), and may block or absorb the light of the first color (e.g., red light) and the light of the third color (e.g., blue light). For example, the second color filter CF2 may be a green color filter and may include a green colorant.

The third color filter CF3 may be disposed on the third planarization layer OC3 in the third light-emitting region LA3. The third color filter CF3 may be surrounded by the second light blocking member BK2. The third color filter CF3 may overlap the light transmission part LTU in the thickness direction. The third color filter CF3 may selectively transmit the light of the third color (e.g., blue light) and may block or absorb the light of the first color (e.g., red light) and the light of the second color (e.g., green light). For example, the third color filter CF3 may be a blue color filter and may include a blue colorant.

The first to third color filters CF1, CF2, and CF3 may absorb some of light introduced from the outside of the display device 10 to reduce reflected light due to external light. Therefore, the first to third color filters CF1, CF2, and CF3 may prevent color distortion due to reflection of the external light.

The first to third color filters CF1, CF2, and CF3 are directly disposed on the third planarization layer OC3 of the wavelength conversion layer WLCL, so that the display device 10 may not require a separate substrate for the first to third color filters CF1, CF2, and CF3. Therefore, the thickness of the display device 10 may be relatively reduced.

The third protective layer PAS3 may cover (or overlap) the first to third color filters CF1, CF2, and CF3. The third protective layer PAS3 may protect the first to third color filters CF1, CF2, and CF3.

The encapsulation layer TFE may be disposed on the third protective layer PAS3 of the color filter layer CFL. The encapsulation layer TFE may cover (or overlap) upper and side surfaces of the display layer DPL. For example, the encapsulation layer TFE may include at least one inorganic film to prevent the penetration of oxygen or moisture. The encapsulation layer TFE may include at least one organic film to protect the display device 10 from foreign matter such as dust.

The conductive parts CDT may be disposed in the first substrate SUB1. The conductive parts CDT may electrically connect the first connection line CWL1 disposed on one surface (or a first surface) of the first substrate SUB1 and the first pad portion PD1 disposed on the other surface (or a second surface) of the first substrate SUB1. The conductive parts CDT may extend in the thickness direction (e.g., the Z-axis direction) of the first substrate SUB1. Each of the conductive parts CDT may be exposed on each of one surface and the other surface of the first substrate SUB1 in the process of manufacturing the display device 10. An upper end of each of the conductive parts CDT and the one surface of the first substrate SUB1 may be disposed on the same plane, and the other end of each of the conductive parts CDT and the other surface of the first substrate SUB1 may be disposed on the same plane.

The conductive parts CDT, the first connection line CWL1, and the first pad portion PD1 may include different materials. The conductive parts CDT may include carbon nanotubes. In the process of manufacturing the display device 10, the conductive parts CDT may be arranged in the thickness direction (e.g., the Z-axis direction) of the first substrate SUB1 by an electric field. A diameter of each of the conductive parts CDT in a plan view may be about 100 nm or less. The conductive parts CDT may have improved electrical conductivity and strength.

Since the conductive parts CDT are formed before the first substrate SUB1, the first substrate SUB1 may not include separate contact holes for the conductive parts CDT. The display device 10 includes the conductive parts CDT, so that the display device 10 may not include a hole passing through the first substrate SUB1, and may electrically connect the first connection line CWL1 disposed on the surface of the first substrate SUB1 and the first pad portion PD1 disposed on the other surface of the first substrate SUB1. The display device 10 includes the first pad portion PD1, the second pad portion PD2, the flexible film FPCB, and the data driver SIC disposed on a lower surface of the first substrate SUB1, thereby minimizing an area of the non-display area NDA. A process of forming the through-hole in the first substrate SUB1 in order to electrically connect the first pad portion PD1 and the first connection line CWL1 may be omitted to reduce the degree of difficulty of a manufacturing process of the display device 10, thereby improving the productivity and reliability.

The first pad portion PD1 may be disposed on the lower surface of the first substrate SUB1. The first pad portion PD1 may cover (or overlap) the other ends of the conductive parts CDT. For example, a first pad portion PD1 may correspond to ten or more conductive parts CDT, but the disclosure is not limited thereto. The first pad portion PD1 may be electrically connected to the first connection line CWL1 by the conductive parts CDT. The first pad portion PD1 may supply an electric signal, received from the flexible film FPCB, to the first connection line CWL1 by the second pad portion PD2.

The second pad portion PD2 may be disposed on the lower surface of the first substrate SUB1 and may be spaced apart from the first pad portion PD1. The second pad portion PD2 may be electrically connected to the first pad portion PD1 by the lead line LDL. The second pad portion PD2 may receive various voltages or signals from the flexible film FPCB and may supply the corresponding voltage or signal to the first pad portion PD1, the first connection line CWL1, and the second connection line CWL2.

A connection film ACF may attach the flexible film FPCB to the second pad portion PD2. One surface of the connection film ACF may be attached to the second pad portion PD2, and the other surface of the connection film ACF may be attached to the flexible film FPCB. For example, the connection film ACF may cover (or overlap) the entire second pad portion PD2, but the disclosure is not limited thereto.

The connection film ACF may include an anisotropic conductive film. In case that the connection film ACF includes the anisotropic conductive film, the connection film ACF may have conductivity in a region in which the second pad portion PD2 and a contact pad of the flexible film FPCB contact each other, and the flexible film FPCB may be electrically connected to the second pad portion PD2.

The flexible film FPCB may be disposed on the lower surface of the first substrate SUB1. One side of the flexible film FPCB may be connected to the second pad portion PD2, and the other side of the flexible film FPCB may be connected to a source circuit board (not shown) on the lower surface of the first substrate SUB1. The flexible film FPCB may transmit a signal from the data driver SIC to the display device 10. For example, the data driver SIC may be an integrated circuit (IC). The data driver SIC may convert digital video data into an analog data voltage based on a data control signal of a timing control part and may supply the analog data voltage to the data line of the display area DA by the flexible film FPCB.

Figure 4:
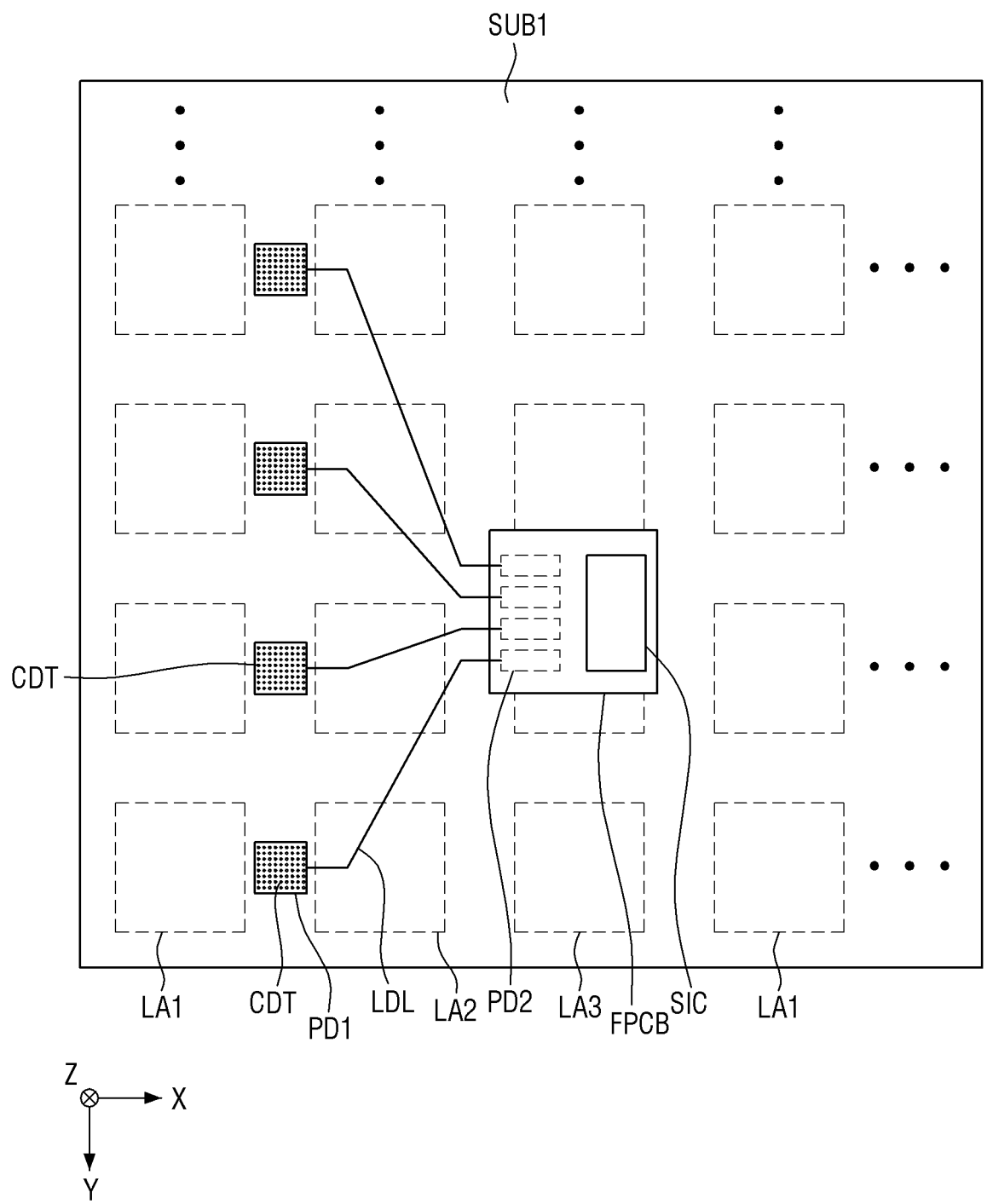
FIG. 4 is a bottom view schematically illustrating the display device according to an embodiment.

FIG. 4 is a bottom view schematically illustrating the display device according to an embodiment.

Referring to FIG. 4, the first pad portion PD1 may be disposed on the lower surface of the first substrate SUB1. The first pad portion PD1 may cover (or overlap) the other ends of the conductive parts CDT. For example, a first pad portion PD1 may correspond to ten or more conductive parts CDT, but the disclosure is not limited thereto. The first pad portion PD1 may be electrically connected to the first connection line CWL1 by the conductive parts CDT. The first pad portion PD1 may supply an electrical signal, received from the flexible film FPCB by the second pad portion PD2, to the first connection line CWL1.

The conductive parts CDT may be disposed in the first substrate SUB1. The conductive parts CDT may electrically connect the first connection line CWL1 disposed on one surface of the first substrate SUB1 and the first pad portion PD1 disposed on the other surface of the first substrate SUB1. The conductive parts CDT, the first connection line CWL1, and the first pad portion PD1 may include different materials. The conductive parts CDT may include carbon nanotubes. The diameter of each of the conductive parts CDT in a plan view may be about 100 nm or less. The conductive parts CDT may have improved electrical conductivity and strength.

The second pad portion PD2 may be disposed on the lower surface of the first substrate SUB1 and may be spaced apart from the first pad portion PD1. The second pad portion PD2 may be electrically connected to the first pad portion PD1 by the lead line LDL. The second pad portion PD2 may receive various voltages or signals from the flexible film FPCB and may supply the corresponding voltage or signal to the first connection line CWL1 by the first pad portion PD1.

The flexible film FPCB may be disposed on the lower surface of the first substrate SUB1. One side (or a first side) of the flexible film FPCB may be connected to the second pad portion PD2, and the other side (or a second side) of the flexible film FPCB may be connected to a source circuit board (not shown) on the lower surface of the first substrate SUB1. The flexible film FPCB may transmit a signal from the data driver SIC to the display device 10.

FIGS. 5 to 12 are schematic cross-sectional views illustrating a process of manufacturing a display device according to an embodiment.

Figure 5:
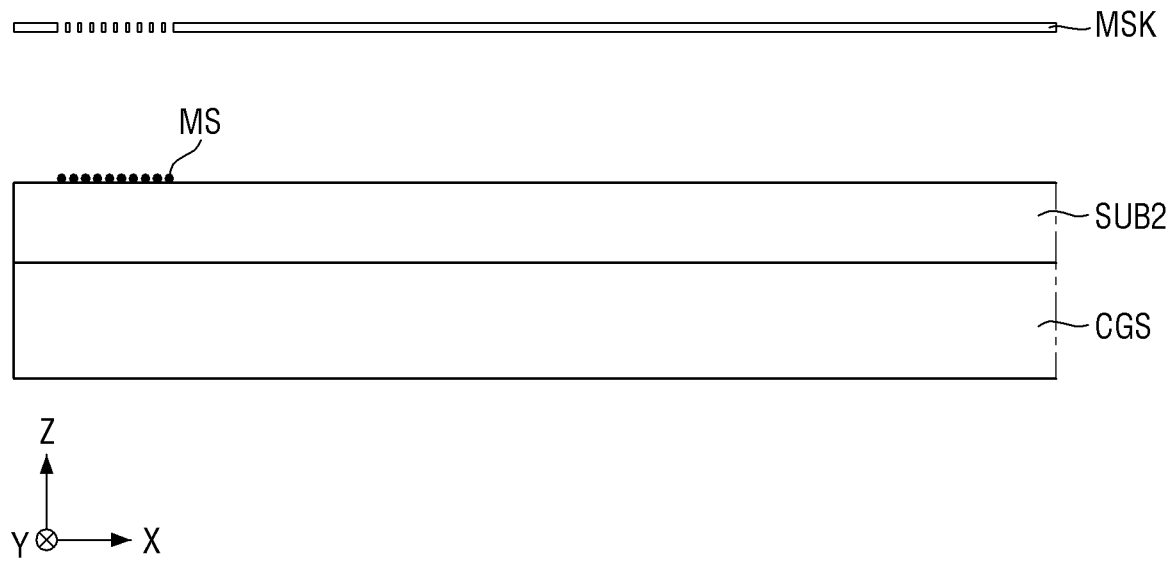
FIGS. 5 to 12 are cross-sectional views schematically illustrating a process of manufacturing a display device according to an embodiment.

As illustrated in FIG. 5, a carrier substrate CGS may support the display device 10 in the process of manufacturing the display device 10. For example, the carrier substrate CGS may be a carrier glass, but the disclosure is not limited thereto.

A second substrate SUB2 may be disposed on the carrier substrate CGS. The second substrate SUB2 may be a base substrate or a base member and may be made of an insulating material such as a polymer resin. The second substrate SUB2 may be a flexible substrate that can be bent, folded, and rolled. For example, the second substrate SUB2 may include polyimide (PI), but the disclosure is not limited thereto.

Metal seeds MS may be disposed on the second substrate SUB2. The metal seeds MS may be aligned on the second substrate SUB2 by a mask MSK. The metal seeds MS may determine a region in which the conductive parts CDT are to be disposed. For example, the metal seeds MS may include one among gold (Au), silver (Ag), cobalt (Co), titanium (Ti), nickel (Ni), copper (Cu), zinc (Zn), tin (Sn), aluminum (Al), chromium (Cr), manganese (Mn), and magnesium (Mg), or an alloy thereof.

Figure 6:
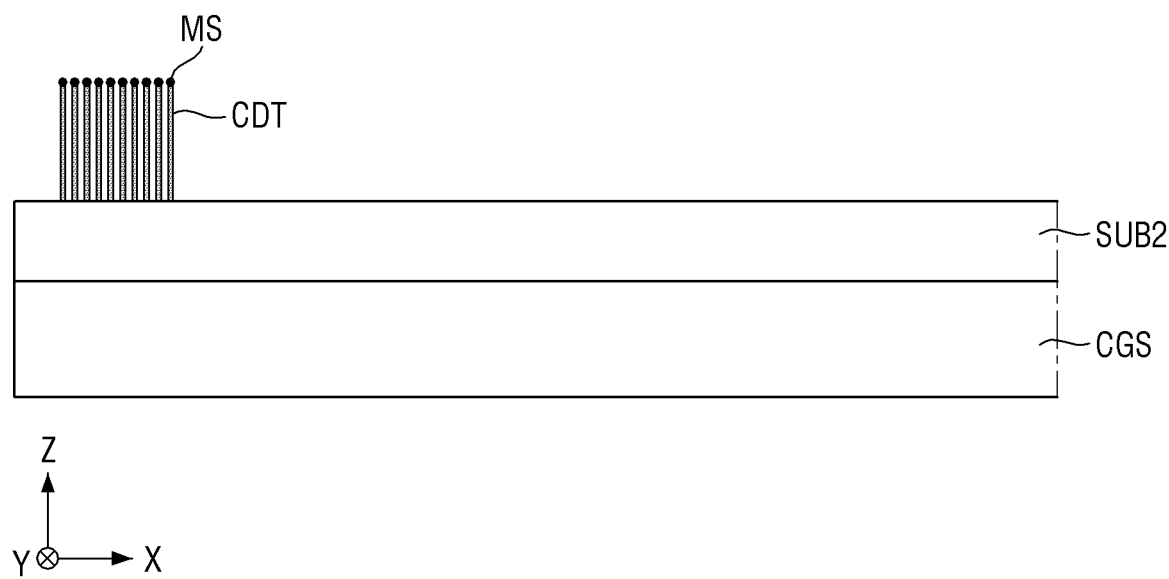

As illustrated in FIG. 6, the conductive parts CDT may be deposited on the second substrate SUB2. The conductive parts CDT may include carbon nanotubes. An electric field may be formed between the metal seeds MS and the second substrate SUB2 before the conductive parts CDT are deposited. For example, the second substrate SUB2 may become a positive electrode, and the metal seeds MS may become a negative electrode, but the disclosure is not limited thereto. The conductive parts CDT may be vertically aligned between the metal seeds MS and the second substrate SUB2 by the electric field. Here, the conductive parts CDT may be more vertically aligned closer to the vertical as the strength of the electric field increases. One end (or a first end) of each of the conductive parts CDT may contact each of the metal seeds MS, and the other end (or another end) of each of the conductive parts CDT may contact the second substrate SUB2. Therefore, the conductive parts CDT may be aligned on the second substrate SUB2 by controlling the electric field. The diameter of each of the conductive parts CDT in a plan view may be about 100 nm or less. The conductive parts CDT may have improved electrical conductivity and strength.

A portion not corresponding to the metal seeds MS among materials forming a conductive part covering (or overlapping) the second substrate SUB2 may be removed using an etching solution. A portion that does not overlap the metal seeds MS in the thickness direction (e.g., the Z-axis direction) among the material forming the conductive part may be removed. Therefore, the conductive parts CDT may have an elongated shape while being spaced apart from each other.

Figure 7:
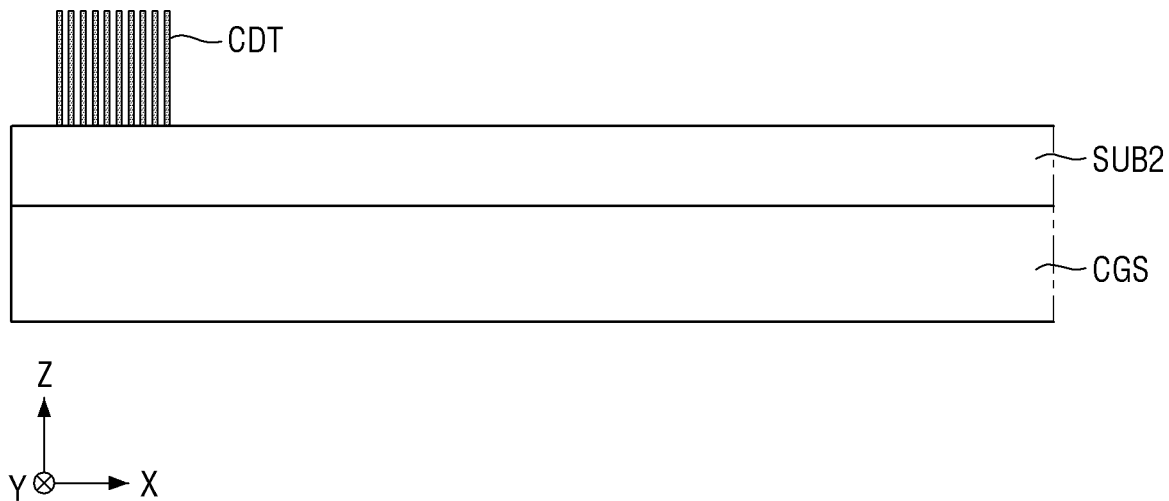

As illustrated in FIG. 7, the metal seeds MS may be removed by an ashing process. The conductive parts CDT may not be affected by the process of removing the metal seeds MS. Therefore, the upper ends of the conductive parts CDT may be exposed.

Figure 8:
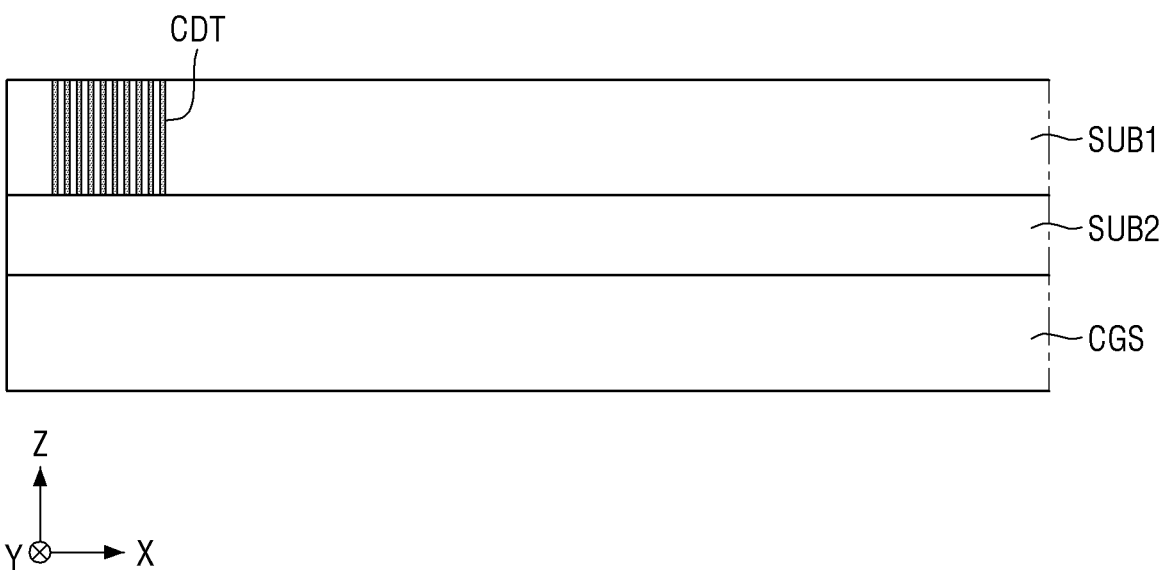

As illustrated in FIG. 8, the first substrate SUB1 may be formed on the second substrate SUB2 while covering (or overlapping) side surfaces of each of the conductive parts CDT. The first substrate SUB1 may be a base substrate or a base member and may be made of an insulating material such as a polymer resin. The first substrate SUB1 may be a flexible substrate that can be bent, folded, and rolled. For example, the first substrate SUB1 may include polyimide (PI), but the disclosure is not limited thereto.

The upper ends of the conductive parts CDT and an upper end of the first substrate SUB1 may be disposed on the same plane. Therefore, the upper ends of the conductive parts CDT may be exposed on an upper surface of the first substrate SUB1.

Figure 9:
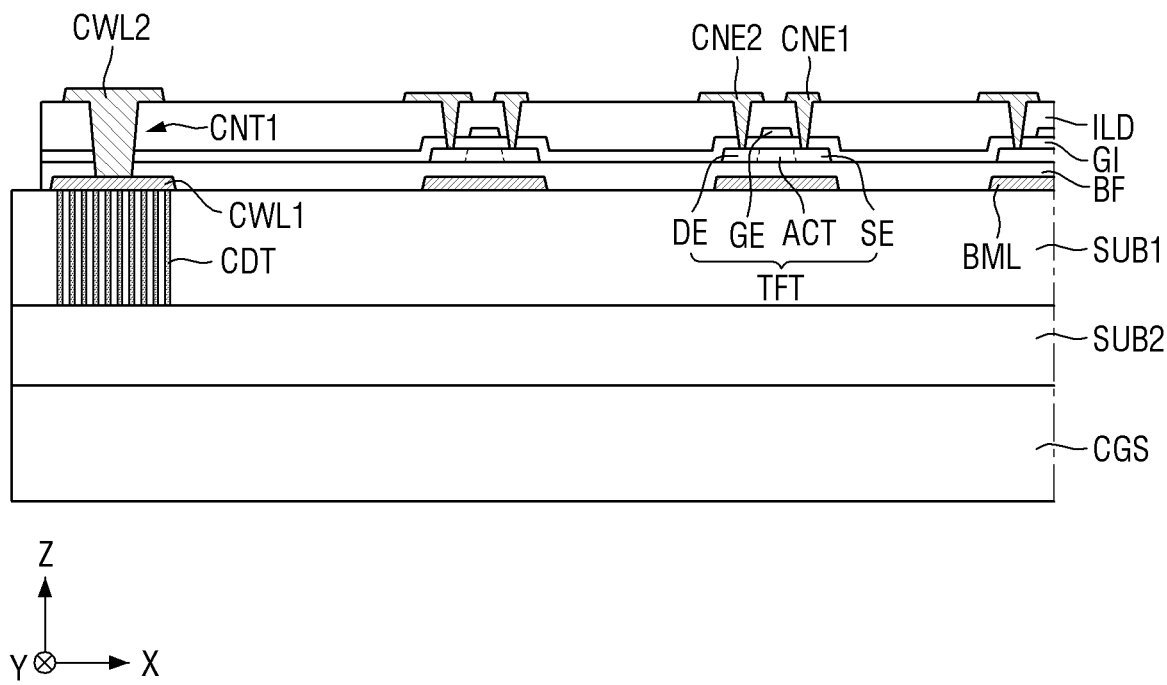

As illustrated in FIG. 9, the first connection line CWL1 may be disposed on the first substrate SUB1. The first connection line CWL1 may cover (or overlap) one end (or a first end) of each of the conductive parts CDT. For example, a first connection line CWL1 may correspond to ten or more conductive parts CDT, but the disclosure is not limited thereto. The light blocking layer BML may be disposed on the first substrate SUB1 to be spaced apart from the first connection line CWL1.

The buffer layer BF may cover (or overlap) the first connection line CWL1, the light blocking layer BML, and the first substrate SUB1. The semiconductor region ACT, the source electrode SE, and the drain electrode DE of the thin film transistor TFT may be disposed on the buffer layer BF to overlap the light blocking layer BML. The gate insulating film GI may cover the semiconductor region ACT, the source electrode SE, and the drain electrode DE of the thin film transistor TFT. The gate electrode GE of the thin film transistor TFT may be disposed on the gate insulating film GI to overlap the semiconductor region ACT. The interlayer insulating film ILD may cover the gate electrode GE.

The second connection line CWL2 may be disposed on the interlayer insulating film ILD. The second connection line CWL2 may be inserted into the first contact hole CNT1 passing through the interlayer insulating film ILD, the gate insulating film GI, and the buffer layer BF to be connected to the first connection line CWL1. The first and second connection electrodes CNE1 and CNE2 may be disposed on the interlayer insulating film ILD to be spaced apart from the second connection line CWL2.

Figure 10:
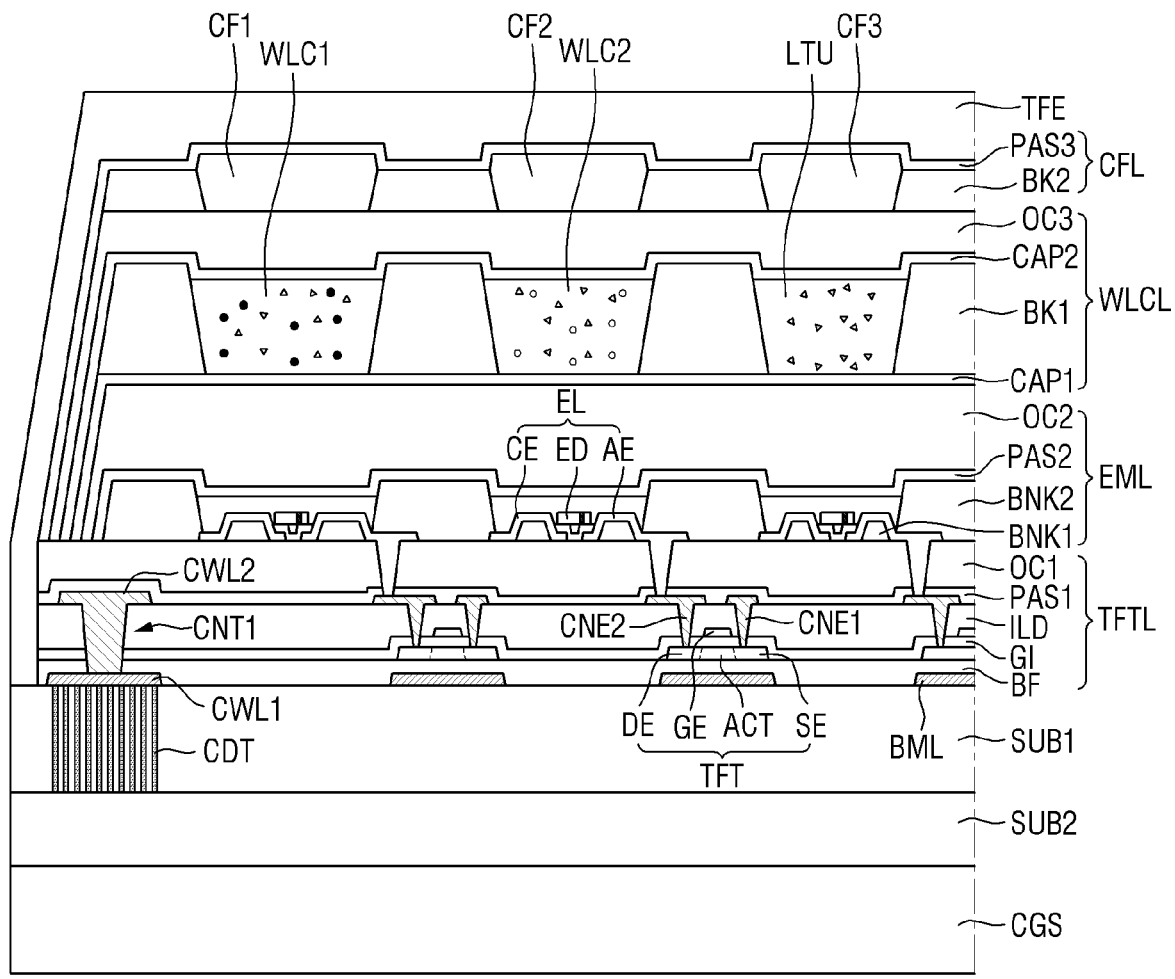

As illustrated in FIG. 10, the first protective layer PAS1 may cover (or overlap) the first and second connection electrodes CNE1 and CNE2, the second connection line CWL2, and the interlayer insulating film ILD. The first planarization layer OC1 may be provided on the first protective layer PAS1 to planarize the upper end of the thin film transistor layer TFTL.

The light-emitting element layer EML, the wavelength conversion layer WLCL, and the color filter layer CFL may be sequentially stacked on the thin film transistor layer TFTL. The encapsulation layer TFE may cover upper and side surfaces of the display layer DPL.

Figure 11:
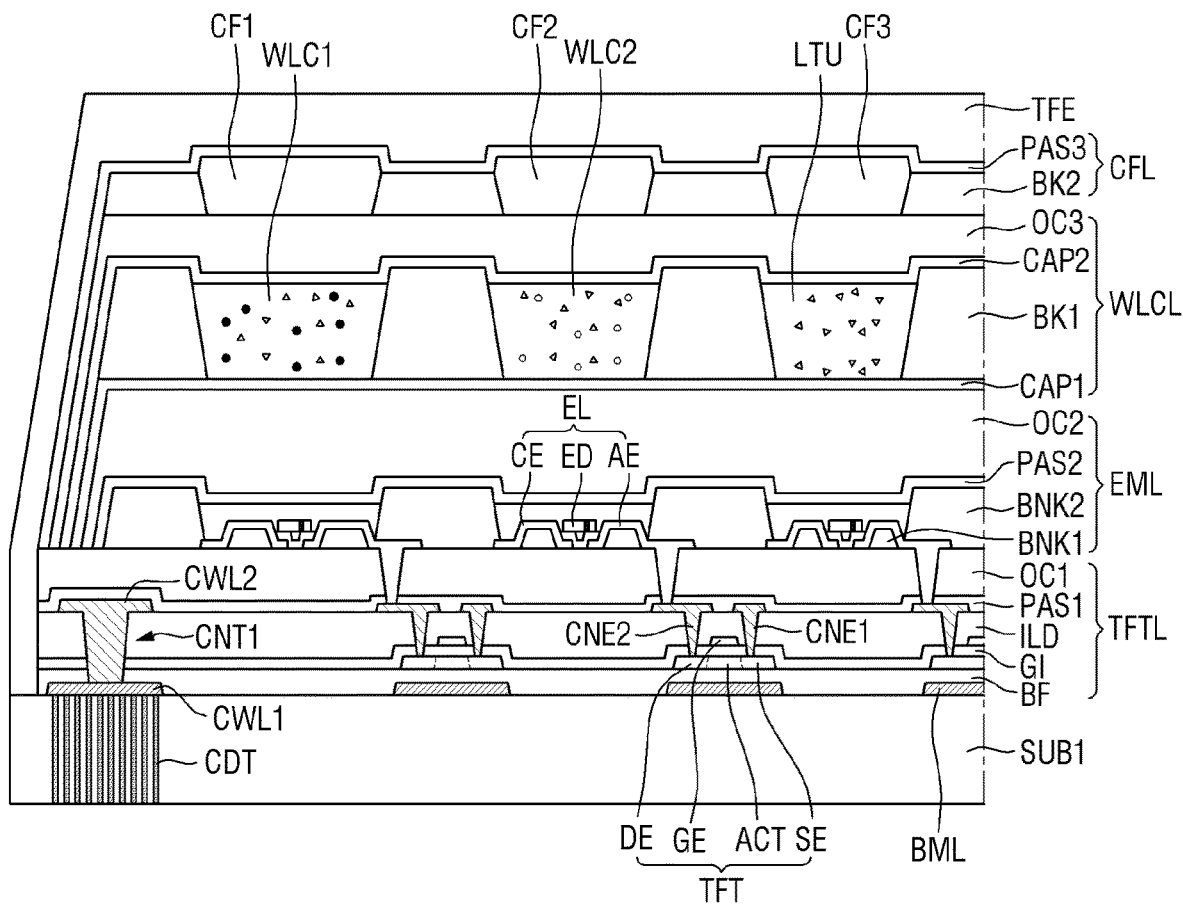

As illustrated in FIG. 11, the carrier substrate CGS may be removed from a lower surface of the second substrate SUB2. For example, the carrier substrate CGS may be removed from the lower surface of the second substrate SUB2 by using a sacrificial layer (not shown) disposed between the carrier substrate CGS and the second substrate SUB2, but the disclosure is not limited thereto.

The second substrate SUB2 may be removed from the lower surface of the first substrate SUB1. For example, the second substrate SUB2 may be removed by at least one of a dry etching process, a wet etching process, a chemical mechanical polishing (CMP) process, and a laser etching process. After the second substrate SUB2 is removed, the lower surface of the first substrate SUB1 and the other ends of the conductive parts CDT may be exposed.

Figure 12:
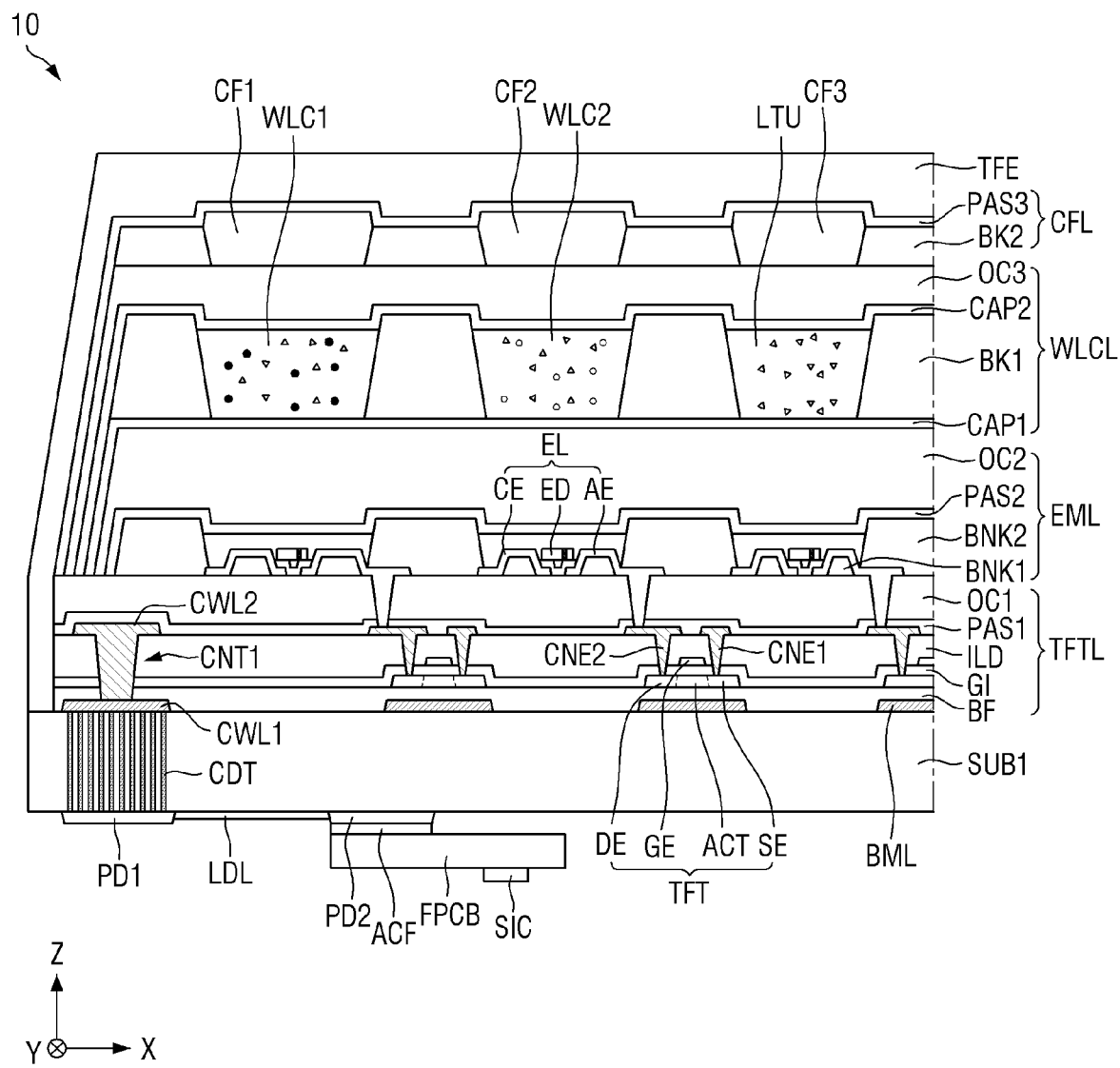

As illustrated in FIG. 12, the first pad portion PD1 may be disposed on the lower surface of the first substrate SUB1. The first pad portion PD1 may cover (or overlap) the other ends of the conductive parts CDT. For example, a first pad portion PD1 may correspond to ten or more conductive parts CDT, but the disclosure is not limited thereto. The first pad portion PD1 may be electrically connected to the first connection line CWL1 by the conductive parts CDT. The first pad portion PD1 may supply an electrical signal received from the flexible film FPCB by the second pad portion PD2 to the first connection line CWL1.

The second pad portion PD2 may be disposed on the lower surface of the first substrate SUB1 and may be spaced apart from the first pad portion PD1. The second pad portion PD2 may be connected to the first pad portion PD1 through the lead line LDL. The second pad portion PD2 may receive various voltages or signals from the flexible film FPCB and may supply the corresponding voltage or signal to the first pad portion PD1, the first connection line CWL1, and the second connection line CWL2.

The flexible film FPCB may be disposed on the lower surface of the first substrate SUB1. One side (or a first side) of the flexible film FPCB may be connected to the second pad portion PD2, and the other side (or a second side) of the flexible film FPCB may be connected to a source circuit board (not shown) on the lower surface of the first substrate SUB1. The flexible film FPCB may transmit a signal from the source driver SIC to the display device 10.

Since the conductive parts CDT are formed before the first substrate SUB1, the first substrate SUB1 may not include separate contact holes for the conductive parts CDT. The display device 10 includes the conductive parts CDT, so that the display device 10 may not include a hole passing through the first substrate SUB1, and may electrically connect the first connection line CWL1 disposed on a surface of the first substrate SUB1 and the first pad portion PD1 disposed on another (or the other) surface of the first substrate SUB1. The display device 10 includes the first pad portion PD1, the second pad portion PD2, the flexible film FPCB, and the data driver SIC disposed on the lower surface of the first substrate SUB1, thereby minimizing an area of the non-display area NDA. A process of forming the through-hole in the first substrate SUB1 in order to electrically connect the first pad portion PD1 and the first connection line CWL1 may be omitted to reduce the degree of difficulty of a manufacturing process of the display device 10, thereby improving the productivity and reliability.

Figure 13:
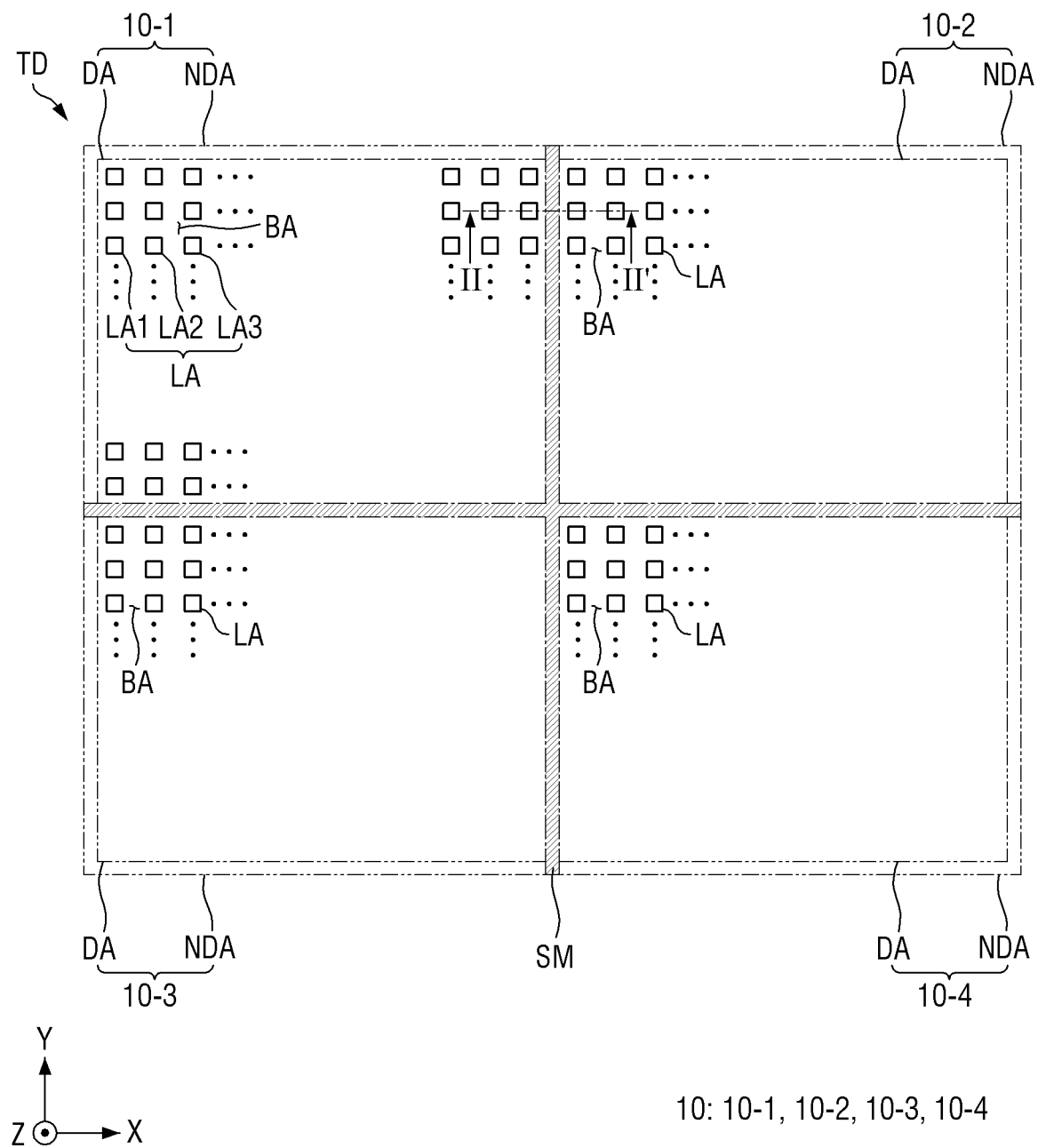
FIG. 13 is a plan view schematically illustrating a coupling structure of a tiled display device according to an embodiment.
Figure 14:
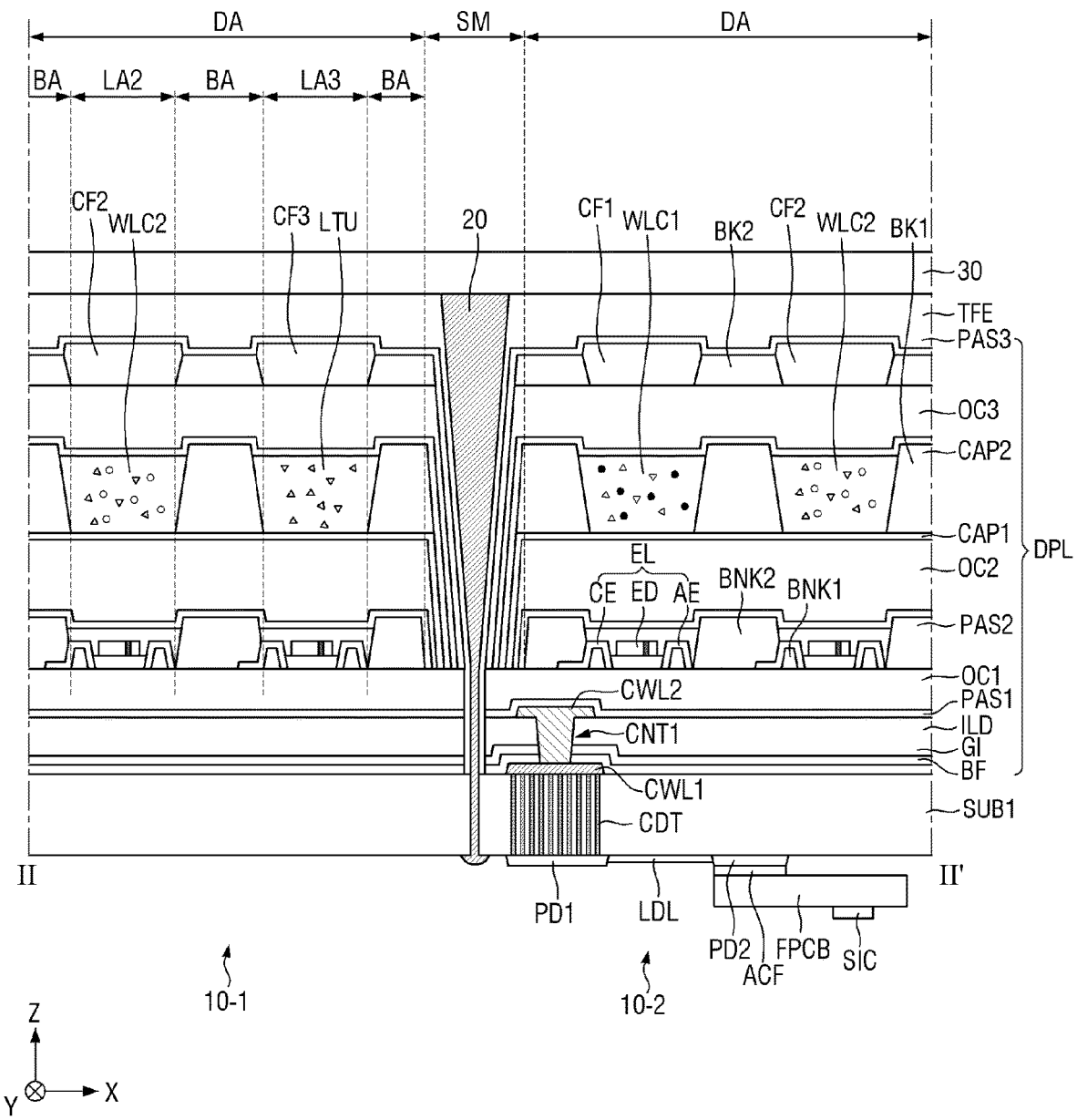
FIG. 14 is a schematic cross-sectional view taken along line II-II' in FIG. 13.

FIG. 13 is a plan view schematically illustrating a coupling structure of a tiled display device according to an embodiment, and FIG. 14 is a schematic cross-sectional view taken along line II-II' in FIG. 13.

Referring to FIGS. 13 and 14, a tiled display device TD may include display devices 10, a coupling member 20, and a cover member 30. The display devices 10 may be arranged in a lattice shape, but the disclosure is not limited thereto. The display devices 10 may be connected in the first direction (the X-axis direction) or the second direction (the Y-axis direction), and the tiled display device TD may have a specific shape. For example, the display devices 10 may have the same size, but the disclosure is not limited thereto. As another example, the display devices 10 may have different sizes from each other.

The tiled display device TD may include first to fourth display devices 10-1 to 10-4. The number and coupling relationship of the display devices 10 are not limited to the embodiment of FIG. 13. The number of display devices 10 may be determined according to a size of each of the display device 10 and the tiled display device TD.

The display device 10 may include a display area DA and a non-display area NDA. The display area DA may include pixels to display an image. The non-display area NDA may be disposed around the display area DA to surround the display area DA and may not display an image.

The tiled display device TD may include a coupling region SM disposed between display areas DA. The tiled display device TD may be formed by connecting the non-display areas NDA of adjacent display devices 10 to each other. The display devices 10 may be connected to each other by the coupling member 20 or an adhesive member disposed in the coupling region SM. The coupling region SM of each of the display devices 10 may not include a pad portion or no flexible film attached to a pad portion. Therefore, a distance between the display areas DA of each of the display devices 10 may be so close that the coupling region SM between the display devices 10 is not recognized by a user. A reflectance of external light of the display area DA of each of the display devices 10 and a reflectance of external light of the coupling region SM between the display devices 10 may be substantially the same. Therefore, the tiled display device TD prevents the user from recognizing the coupling region SM between the display devices 10, thereby improving a feeling of disconnection between the display devices 10 and improving the degree of immersion of an image.

The display device 10 may include pixels arranged in rows and columns in the display area DA. Each of the pixels may include a light-emitting region LA defined by a pixel defining film or a bank and may emit light having a predetermined peak wavelength through the light-emitting region LA. For example, the display area DA of the display device 10 may include first to third light-emitting regions LA1, LA2, and LA3. Each of the first to third light-emitting regions LA1, LA2, and LA3 may be a region in which light generated by the light-emitting element EL of the display device 10 is emitted to the outside of the display device 10.

The first to third light-emitting regions LA1, LA2, and LA3 may be sequentially and repeatedly disposed in the first direction (e.g., the X-axis direction) of the display area DA. For example, an area of the first light-emitting region LA1 may be greater than that of the second light-emitting region LA2, and the area of the second light-emitting region LA2 may be greater than that of the third light-emitting region LA3. As another example, the area of the first light-emitting region LA1, the area of the second light-emitting region LA2, and the area of the third light-emitting region LA3 may be substantially the same.

The display area DA of the display device 10 may include a light blocking region BA surrounding light-emitting regions LA. The light blocking region BA may prevent color mixing of light emitted from the first to third light-emitting regions LA1, LA2, and LA3.

The tiled display device TD may allow side surfaces of adjacent display devices 10 to be extended to each other by using the coupling member 20 disposed between the display devices 10. The coupling member 20 may realize the tiled display device TD by connecting side surfaces of the first to fourth display devices 10-1 to 10-4 arranged in the lattice shape. The coupling member 20 may connect a side surface of a first substrate SUB1 and a side surface of an encapsulation layer TFE of the display devices 10 adjacent to each other.

For example, the coupling member 20 may be made of (or include) an adhesive or a double-sided tape having a relatively small thickness, thereby minimizing a gap between the display devices 10. As another example, since the coupling member 20 is formed of a coupling frame having a relatively small thickness, the gap between the display devices 10 may be minimized. Therefore, the tiled display device TD may prevent the user from recognizing the coupling region SM between the display devices 10.

The cover member 30 may be disposed on upper surfaces of the display devices 10 and the coupling member 20 to cover the display devices 10 and the coupling member 20. For example, the cover member 30 may be disposed on an upper surface of the encapsulation layer TFE of each of the display devices 10. The cover member 30 may protect an upper surface of the tiled display device TD.

According to a display device, a manufacturing method thereof, and a tiled display device including the same according to embodiments, since conductive parts are formed before a substrate, the substrate may not include separate contact holes for the plurality of conductive parts. The display device includes the conductive parts, so that the display device may not include a hole passing through the substrate, and may electrically connect a connection line disposed on one surface of the substrate and a pad portion disposed on another surface of the substrate. Therefore, a process of forming a through-hole in the substrate can be omitted to reduce the degree of difficulty of a manufacturing process of the display device, thereby improving productivity and reliability.

According to the display device, the manufacturing method thereof, and the tiled display device including the same according to the embodiments, the connection line disposed on the one surface of the substrate and the pad portion disposed on the other surface of the substrate are connected through the plurality of conductive parts, thereby minimizing (or reducing) an area of a non-display area of the display device. Therefore, in the tiled display device, it is possible to prevent a user from recognizing a non-display area or a boundary portion between display devices by minimizing a gap between the display devices.

Effects according to the embodiments are not limited by the contents illustrated above, and more various effects are included in the disclosure.

What is claimed is:

1. A display device comprising:
a first substrate;
a first connection line disposed on a surface of the first substrate;
a thin film transistor layer disposed on the first connection line, the thin film transistor layer comprising a plurality of thin film transistors;
a first pad portion disposed on another surface of the first substrate; and
a plurality of conductive parts disposed in the first substrate, including a material different from those of the first connection line and the first pad portion, and electrically connecting the first connection line and the first pad portion,
wherein the plurality of conductive parts include carbon nanotubes.

2. The display device of claim 1, wherein a diameter of each of the plurality of conductive parts on a plane is about 100 nm or less.

3. The display device of claim 1, wherein
the first connection line overlaps an end of each of the plurality of conductive parts, and
the first pad portion overlaps another end of each of the plurality of conductive parts.

4. The display device of claim 1, further comprising a light blocking layer, wherein
the light blocking layer and the first connection line are disposed on a same layer, and
the light blocking layer overlaps each of the plurality of thin film transistors in a thickness direction of the first substrate.

5. The display device of claim 4, wherein the thin film transistor layer comprises:
a buffer layer overlapping the first connection line and the light blocking layer;
a gate insulating film disposed on the buffer layer;
an interlayer insulating film disposed on the gate insulating film; and
a connection electrode disposed on the interlayer insulating film and electrically connected to the thin film transistor.

6. The display device of claim 5, wherein the thin film transistor layer comprises a second connection line spaced apart from the connection electrode on the interlayer insulating film and electrically connected to the first connection line.

7. The display device of claim 1, further comprising:
a flexible film disposed on the another surface of the first substrate and connected to the first pad portion; and
a data driver disposed on the flexible film and supplying a data voltage to the first pad portion.

8. A tiled display device comprising:
a plurality of display devices each including:
a display area including a plurality of pixels; and
a non-display area surrounding the display area; and
a coupling member connecting the plurality of display devices,
wherein each of the plurality of display devices comprises:
a substrate;
a connection line disposed on a surface of the substrate;
a thin film transistor layer disposed on the connection line and including a plurality of thin film transistors;
a pad portion disposed on another surface of the substrate; and
a plurality of conductive parts disposed in the substrate, including a material different from those of the connection line and the pad portion, and electrically connecting the connection line and the pad portion.

9. The tiled display device of claim 8, wherein the plurality of conductive parts include carbon nanotubes.

10. The tiled display device of claim 8, wherein
the connection line overlaps an end of each of the plurality of conductive parts, and the pad portion overlaps another end of the plurality of conductive parts.

11. The tiled display device of claim 8, wherein each of the plurality of display devices comprises a light blocking layer, the light blocking layer and the connection line are disposed on a same layer, and the light blocking layer overlaps each of the plurality of thin film transistors in a thickness direction of the substrate.

* * * * *